United States Patent
Murao et al.

(10) Patent No.: US 7,514,665 B2
(45) Date of Patent: Apr. 7, 2009

(54) DIFFERENTIAL AMPLIFIER CIRCUIT WITH RECTIFIER FOR OPTICAL PICK-UP DEVICE

(75) Inventors: Satoshi Murao, Kagoshima (JP); Hideo Fukuda, Kyoto (JP); Shinichi Miyamoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 63 days.

(21) Appl. No.: 11/533,413

(22) Filed: Sep. 20, 2006

(65) Prior Publication Data

US 2007/0075223 A1    Apr. 5, 2007

(30) Foreign Application Priority Data

Oct. 3, 2005    (JP)    ............... 2005-289816

(51) Int. Cl.
  H03F 3/08 (2006.01)
  H03F 3/45 (2006.01)
  G01J 1/44 (2006.01)
  H03K 17/78 (2006.01)
  H03G 3/00 (2006.01)

(52) U.S. Cl. .............. 250/214 A; 250/214 R; 250/214 SW; 330/254; 330/278

(58) Field of Classification Search ............. 250/214 R, 250/214 A, 214 LA, 214 LS, 214.1, 214 SW; 369/134, 47.25, 124.01, 44.41, 44.37, 44.35; 327/514; 360/46, 67, 68; 330/250, 252, 330/254, 260, 271, 278

See application file for complete search history.

(56) References Cited

U.S. PATENT DOCUMENTS 6,480,042 B2 * 11/2002 Kadowaki ................... 327/103

7,002,881 B2    2/2006 Okuda et al.
2003/0231574 A1 * 12/2003 Okuda et al. ........... 369/124.12
2006/0103472 A1    5/2006 Fukuda et al.

FOREIGN PATENT DOCUMENTS

JP    2001-202646    7/2001
JP    2004-022051    1/2004

OTHER PUBLICATIONS

English language Abstract of JP 2004-022051.
English language Abstract of JP 2001-202646.
U.S. Appl. No. 11/531,451 to Fukuda et al., which was filed on Sep. 13, 2006.
U.S. Appl. No. 11/554,742 to Fukuda et al., which was filed on Oct. 31, 2006.

* cited by examiner

*Primary Examiner*—Georgia Y Epps
*Assistant Examiner*—Don Williams
(74) *Attorney, Agent, or Firm*—Greenblum & Bernstein, P.L.C.

(57) ABSTRACT

A light-receiving amplifier circuit in which diodes are commonly connected to a differential amplifier circuit including a transistor of a differential input stage that is an inverting input unit, and are connected between photodiodes (PDs) biased in a forward direction with respect to a direction of photocurrent, and current supply switch transistors. Current supply switch transistors are each connected in parallel between a differential input transistor and a corresponding PD. When light enters into a first PD, a corresponding transistor is turned ON, while a non-corresponding transistor is turned OFF. A non-corresponding diode becomes biased in a backward direction, so that a photocurrent generated due to the light having entered into a second PD is prevented from flowing into the differential amplifier circuit.

9 Claims, 9 Drawing Sheets

PRIOR ART

DIFFERENTIAL AMPLIFIER CIRCUIT WITH RECTIFIER FOR OPTICAL PICK-UP DEVICE

BACKGROUND OF THE INVENTION (1.) Field of the Invention

The present invention relates to a light-receiving amplifier circuit and an optical pick-up device using the same, and in particular to a technology for realizing a small-scale light-receiving amplifier circuit.

(2.) Description of the Related Art

In recent years, optical disc media (hereinafter simply referred to as "media") such as a Compact Disk (CD), a Digital Versatile Disk (DVD), and the like, are widely used for recording large-volume digital information as represented by video and audio. As has already been known, laser beams of different wavelengths are used for reading and writing information into such various types of medium, depending on the type of medium.

A conventional optical pick-up device that is compliant with both CDs and DVDs is typically provided with a double wavelength semiconductor laser element serving as a light source, and a single optical system to be commonly used by two types of wavelengths. Through the optical system, the optical pick-up device amplifies an electric signal and outputs the amplified signal. The electric signal is obtained by performing photoelectric conversion, using light-receiving elements provided for the respective wavelengths, on a reflected light from media, projected onto a position that differs depending on the wavelength in accordance with a distance from a projecting point of the laser of the respective wavelengths.

As a light-receiving amplifier element suitable for such an optical pick-up device, a light-receiving amplifier circuit in which a light-receiving element and a differential amplifier which amplifies a signal of the light receiving element are provided for the respective wavelengths, and an output amplifier which selectively amplifies one of the outputs from the differential amplifier is known (e.g. see FIGS. 3 and 4, Japanese Laid-Open Patent Application No. 2004-22051).

The structure disclosed in Japanese Laid-Open Patent Application No. 2001-202646 is an example of further downsizing of a light-receiving amplifier circuit. According to this structure, light-receiving elements are separately placed according to different wavelengths, input transistors are set in an input stage of the differential amplifier for the number equal to the number of the light-receiving elements, and a switch is placed between each of the input transistors and each of the light-receiving elements.

The following describes a detailed structure and operation of the conventional light-receiving amplifier circuit disclosed in the above-mentioned Japanese Laid-Open Patent Application No. 2001-202646.

FIG. 1 is a diagram showing the configuration of the conventional light-receiving amplifier circuit. The light-receiving amplifier circuit includes switch elements 1-1, 1-2, 1-3 and 1-4 each of which uses a CMOS transistor, a differential input amplifier 2, two input transistors 2-2 and 2-3 which are placed in parallel on one of the differential inputs, and photodiodes (hereinafter referred to as "PDs") 3 and 4. The PD 3 is connected to a base of the input transistor 2-2 while one end of the switch element 1-1 and one end of the switch element 1-3 are connected to that connection. Likewise, the PD4 is connected to a base of the input transistor 2-3 while one end of the switch element 1-2 and one end of the switch element 1-4 are connected to that connection.

The other ends of the switch elements 1-3 and 1-4 are commonly connected to a gain resistor 2-1. The other ends of the switch elements 1-1, 1-2 are connected to an appropriate potential (ground in this circuit example) so that the input transistor 2-2 is cut-off when the switch element 1-1 is ON and the input transistor 2-3 is cut-off when the switch element 1-2 is ON.

In the case of selecting a DVD photodiode 3, the switch elements 1-1 and 1-4 are turned off and the switch elements 1-2 and 1-3 are turned on, so that the paths from the PD 3 to the gain resistor 2-1 and the input transistor 2-2 respectively are made valid. In contrast, in the case of selecting a CD photodiode 4, the switch elements 1-1 and 1-4 are turned on and the switch elements 1-2 and 1-3 are turned off, so that the paths from the PD4 to the gain resistor 2-1 and the input transistor 2-3 respectively are made valid.

Since no resistors are placed in series between the PD3 and the input transistor 2-2 as well as between the PD4 and the input transistor 2-3, it is possible to switch between the photodiodes without degrading the performance originally provided in an amplifier.

SUMMARY OF THE INVENTION

However, according to the conventional light-receiving amplifier circuit disclosed in the Japanese Laid-Open Patent Application No. 2004-22051, the problem is that the downsizing of a circuit is hard to achieve because differential amplifiers are respectively provided for the respective light-receiving elements of different wavelengths.

This problem is apparent in the case of realizing the downsizing of an optical pick-up device equipped with the existing functions, and in the case of realizing the downsizing of a triple wavelength optical pick-up device compliant with CDs, DVDs, and even with Blue-ray Disks (BDs) with a large memory capacity.

On the other hand, according to the structure disclosed in the Japanese Laid-Open Patent Application No. 2001-202646, it is possible to decrease the number of elements compared with the light-receiving amplifier circuit disclosed in the Japanese Laid-Open Patent Application No. 2004-22051, and thus to realize the downsizing of a light-receiving amplifier.

Nevertheless, a light-receiving amplifier circuit having such a structure has the following problems.

In general, along with the downsizing of optical pick-up devices, there is advancement in the miniaturizing not only of light-receiving amplifier circuits but also of light-receiving elements, resulting in a smaller space between a CD light-receiving element and a DVD light-receiving element. In this case, when light is received by one light-receiving element, a probability at which the light leaks into the other light-receiving element gets higher. An input of the photocurrent, which is caused by the light having leaked into the light-receiving element that is not in use, into an input stage of the differential amplifier may cause offset and noises.

According to the structure disclosed in FIG. 1, the switches 1-1 and 1-2 are placed in parallel with the wirings between the light-receiving elements 3 and 4, and the differential amplifier 2. The wiring which is connected, via the switches 1-1 and 1-2, to the light-receiving element that is not in use is connected to the ground. With such a structure, even when the light leaks as described above, the photocurrent flows into the ground via the switches, therefore, offset and noises are not caused.

However, in the case of using photodiodes of an anode common type in which an anode is connected as a light-receiving element to a constant potential, for instance, a ground, the current caused by leaking light flows into the ground, which may cause noise current to flow into the differential amplifier via the photodiodes.

In order to avoid such a problem, it is conceivable to connect the switches to a constant potential other than a ground. In that case, there is a risk that the current might inversely flows depending on the balance with respect to a cathode potential of the photodiode. Also, the downsizing of the device is inhibited since an external terminal for retaining a new fixed potential is required.

The present invention is conceived in view of the above-mentioned problems, and an object of the present invention is to provide a small light-receiving amplifier circuit with high performance which selectively amplifies one or more photocurrents respectively obtained from plural light-receiving elements and effectively blocks the noise current from a non-selected light-receiving element, in the case of using the anode common type photodiodes.

In order to solve the problems, the light-receiving amplifier circuit of the present invention includes: a differential amplifier circuit; a gain resistor connected between an inverting input unit of the differential amplifier circuit and an output of the differential amplifier circuit; light-receiving elements each of which generates a photocurrent according to an amount of light received; first rectifier cells each of which connects an output of an associated one of the light-receiving elements and the inverting input unit in a direction of the photocurrent; and switches for supplying the photocurrent, each switch being connected to a connection between each of the light-receiving elements and the corresponding first rectifier cell.

It is preferable that the switches are NPN transistors, and a collector of each of the NPN transistors is connected to a power potential, an emitter of each of the NPN transistors is connected to an output of the corresponding light-receiving element, and when a potential higher than a potential of the inverting input unit of the differential amplifier circuit is supplied to a base of each of the NPN transistors, the respective NPN transistors block a supply of photocurrent to the inverting input unit of the differential amplifier circuit by backward biasing the corresponding first rectifier cell.

It is also preferable that the light-receiving amplifier circuit further includes constant current sources which are connected in parallel with each of the light-receiving elements for supplying a current that flows in the same direction as a direction of the photocurrent of the corresponding light-receiving element.

Preferably, the light-receiving amplifier circuit further includes a compensation current source for supplying a reference input unit of the differential amplifier circuit with current, wherein the constant current sources and the compensation current source respectively configure a current mirror circuit, and the constant current sources and the compensation current source respectively supply a same amount of current.

It is desirable that the light-receiving amplifier circuit further includes a second rectifier cell connected between the compensation current source and the reference input unit of the differential amplifier circuit in a forward direction of a current that flows to the compensation current source.

It is also desirable that the light-receiving amplifier circuit further includes first NPN transistors, second NPN transistors, constant current sources and third rectifier cells, wherein one of the first NPN transistors, one of the second NPN transistors, one of the constant current sources and one of the third rectifier cells respectively corresponding to one of the light-receiving elements, a collector of the first NPN transistor and a collector of the second NPN transistor are connected to a power potential, an emitter of the first NPN transistor and an emitter of the second NPN transistor are commonly connected to one end of the constant current source, the other end of the constant current source is grounded, a base of the first NPN transistor is connected to an output of the light-receiving element, a base of the second NPN transistor is connected to one end of the third rectifier cell placed in a direction of a base current, and the other end of the third rectifier cell is connected to a reference input unit of the differential amplifier circuit.

It is preferable that the light-receiving amplifier circuit further includes first NPN transistors, second NPN transistors, constant current sources and a fourth rectifier cell, wherein one of the first NPN transistors, one of the second NPN transistors and one of the constant current sources respectively correspond to one of the light-receiving elements, a collector of the first NPN transistors and a collector of the second NPN transistors are connected to a power potential, an emitter of the first NPN transistor and an emitter of the second NPN transistor are connected to one end of the constant current source, the other end of the constant current source is grounded, a base of the first NPN transistor is connected to an output of the light-receiving element, a base of the second NPN transistor is commonly connected to a base of the second NPN transistor of another one of the light-receiving elements, and is also connected to the fourth rectifier cell placed in a forward direction with respect to a direction of base current, and the other end of the fourth rectifier cell is connected to a reference input unit of the differential amplifier circuit.

It is also preferable that the light-receiving amplifier circuit further includes first NPN transistors, first constant current sources respectively corresponding to each of the light-receiving elements, a second NPN transistor and a second constant current source, wherein a collector of one of the first NPN transistors which corresponds to one of the light-receiving elements is connected to a power potential, an emitter of the first NPN transistor is connected to one end of one of the first constant current source, the other end of the first constant current source is grounded, a base of the first NPN transistor is connected to an output of the light-receiving element, a collector of the second NPN transistor is connected to the power potential, an emitter of the second NPN transistor is connected to one end of the second constant current source, the other end of the second constant current source is grounded, and a base of the second NPN transistor is connected to a reference input unit of the differential amplifier circuit.

The optical pick-up device of the present invention is an optical pick-up device which can reproduce or record information into optical disc media of different types, using plural lights of different wavelengths. Such an optical pick-up device is characterized by the configuration provided at least with a light source that emits plural lights of different wavelengths and the light-receiving amplifier circuit of the present invention, in which the light-receiving elements in the light-receiving amplifier circuit receive the lights of different wavelengths.

With the light-receiving amplifier circuit of the present invention, only the photocurrent which corresponds to a current supply switch to which an input voltage for setting the switch off is applied is selectively amplified by a single differential amplifier circuit. The light-receiving amplifier circuit is realized with a current supply switch provided for the respective light-receiving elements and a rectifier cell in an inversion input unit of the differential amplifier circuit. It is therefore possible to achieve the downsizing of the light-receiving amplifier circuit which selectively amplifies one or more photocurrents generated in the light-receiving elements. Also, it is possible to provide a circuit with high performance which effectively cuts the photocurrent that leaks from the light-receiving element that is not in use.

FURTHER INFORMATION ABOUT TECHNICAL BACKGROUND TO THIS APPLICATION

The disclosure of Japanese Patent Application No. 2005-289816 filed on Oct. 3, 2005 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

The following describes the embodiments of the present invention with reference to the diagrams.

First Embodiment

Figure 1:
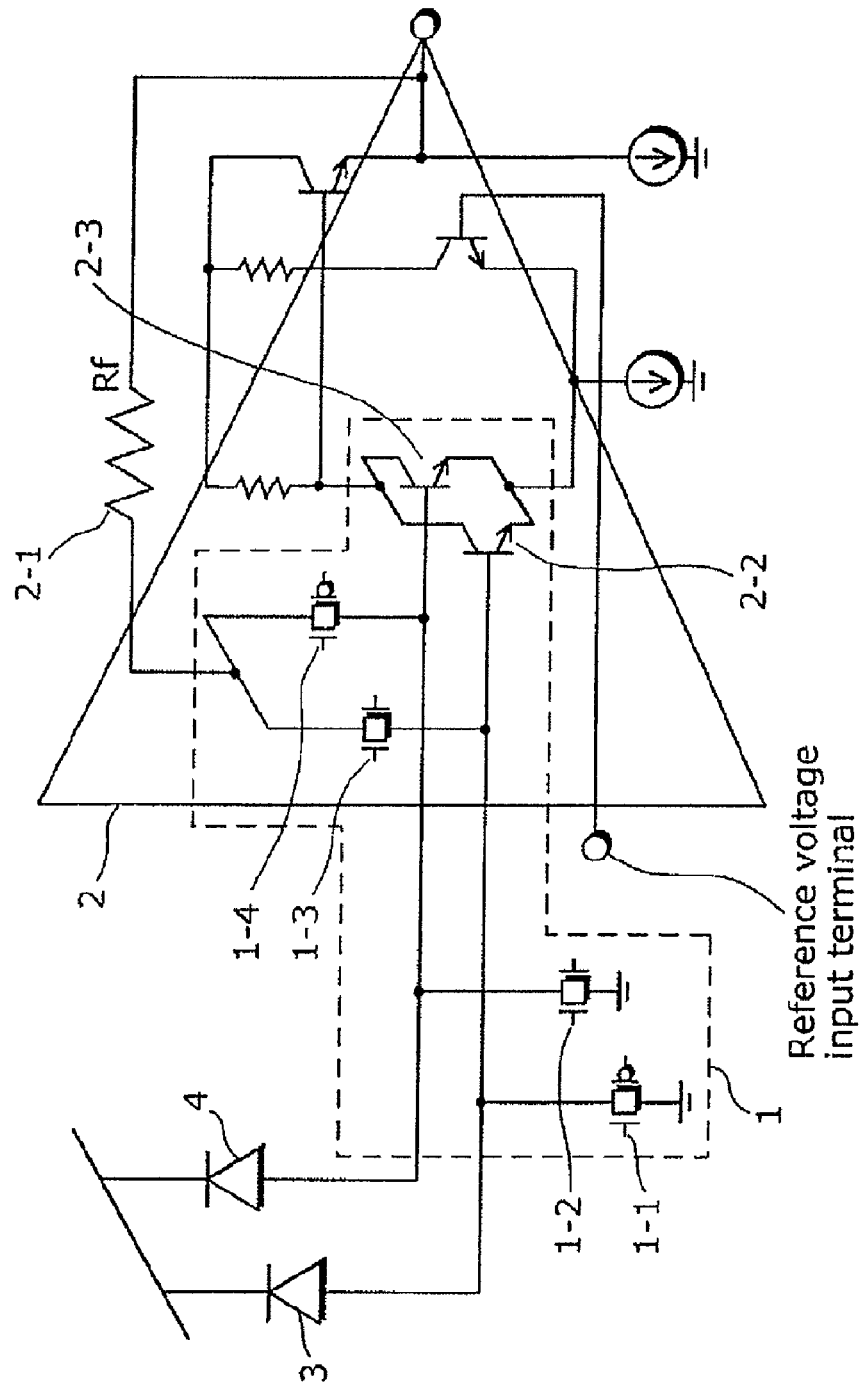
FIG. 1 is a diagram showing a configuration of a conventional light-receiving amplifier circuit.
Figure 2:
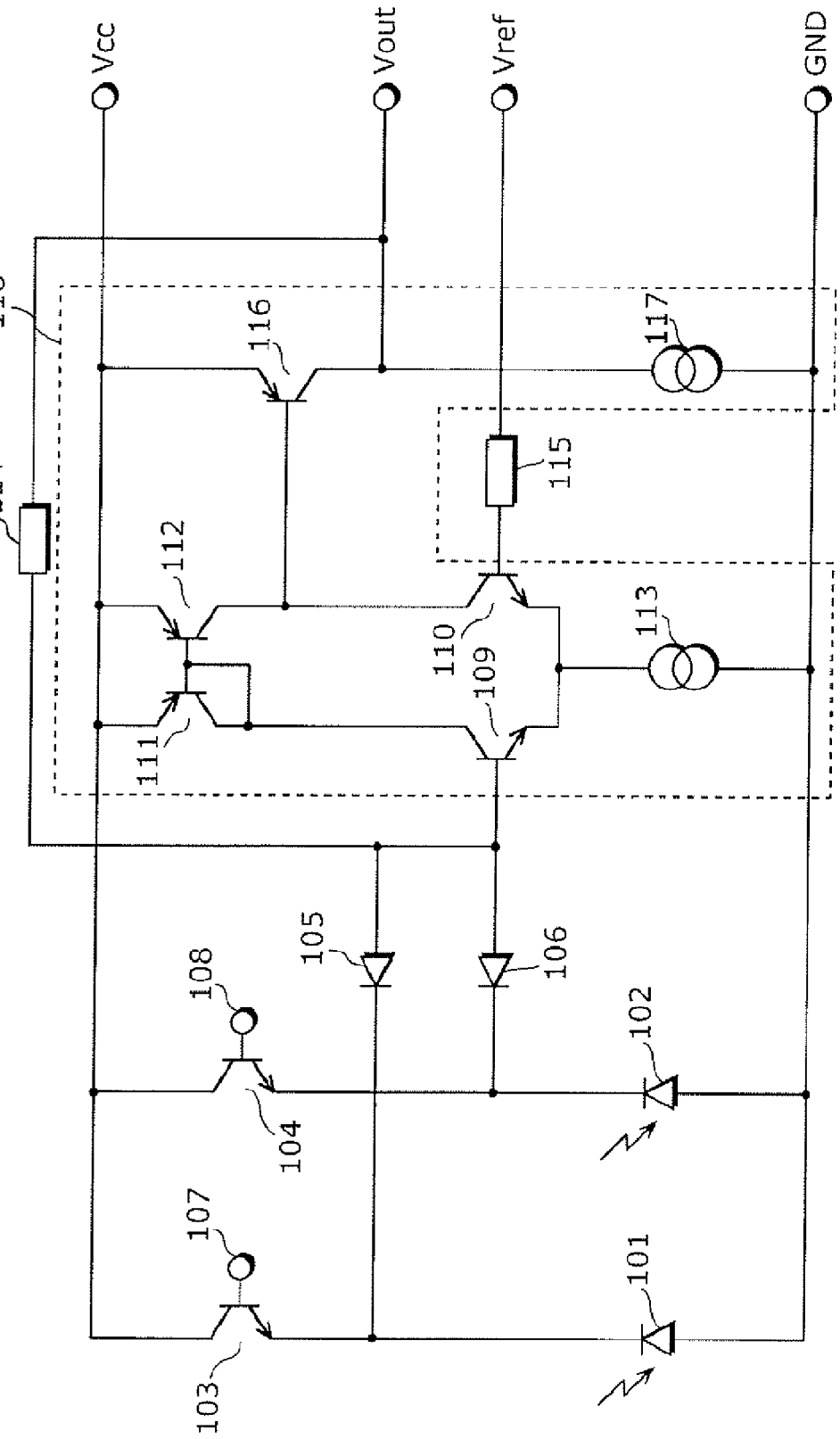
FIG. 2 is a circuit diagram showing an example of the light-receiving amplifier circuit according to a first embodiment of the present invention.

FIG. 2 is a circuit diagram showing an example of the light-receiving amplifier circuit according to the first embodiment of the present invention.

To the input side, of the light-receiving amplifier circuit, at which a gain resistor 114 is located, photodiodes 101 and 102 that are light-receiving elements are connected via diodes 105 and 106 that have a differential amplifier circuit 118 in common and that are rectifier cells connected in forward direction with respect to photocurrent, whereas current supply switch NPN transistors 103 and 104 are connected to a cathode of each of the light-receiving elements.

NPN transistors 109 and 110 are differential input stage transistors, and a base of the NPN transistor 109 is an inverting input terminal of the differential amplifier circuit 118 while a base of the NPN transistor 110 is a reference input terminal. The base of the NPN transistor 110 is connected to a reference voltage Vref via a resistor 115. Emitters of the NPN transistors 109 and 110 are commonly connected to a constant current source 113, and collectors of the NPN transistors 109 and 110 are connected to a current mirror circuit which is configured of PNP transistors 111 and 112.

A base of the PNP transistor 116 of amplifier stage is connected to the collector of the NPN transistor 110 on the reference input side, amplifies the change in collector current and then outputs the resulting signal. The emitter of the PNP transistor 116 is connected to a Vcc line while the collector of the PNP transistor 116 is connected to a constant current source 117. The following describes the operation of the differential amplifier circuit 118.

In the case where a main light is radiated on the PD 101 and a photocurrent is generated in the PD 102 due to stray light, the NPN transistor 103 is turned off by earthing the potential of the base 107 of the NPN transistor 103, and at the same time, the NPN transistor 104 is turned on by setting the potential of the base 108 of the NPN transistor 104 to have a voltage higher than the inverting input potential of the differential amplifier circuit 118. Here, the photocurrent generated in the PD 101 flows to the inversion input side of the differential amplifier circuit 118 via the diode 105, and then, is converted into voltage in the gain resistor 114.

On the other hand, the photocurrent generated in the PD 102 is supplied from the emitter of the NPN transistor 104, and a supply from the differential amplifier circuit 118 is blocked because backward bias is applied to the diode 106.

In contrast, in the case where a main light is radiated on the PD 102 and a photocurrent is generated in the PD 101 due to stray light, the NPN transistor 104 is turned off by earthing the potential of the base 108 of the NPN transistor 104, and at the same time, the NPN transistor 103 is turned on by setting the potential of the base 107 of the NPN transistor 103 to have a voltage higher than the inverting input potential of the differential amplifier circuit 118. Here, the photocurrent generated in the PD 102 flows to the inverting input side of the differential amplifier circuit 118 via the diode 106, and then is converted into voltage in the gain resistor 114.

In contrast, the photocurrent generated in the PD 101 is supplied from the emitter of the NPN transistor 103, and a supply from the differential amplifier circuit 118 is blocked because backward bias is applied to the diode 105.

As described above, with the light-receiving amplifier circuit of the present invention, by putting the diodes that are placed in series between the PDs and the input of the differential amplifier circuit in the backward bias state, it is possible to prevent the photocurrent from flowing from the PD that is not in use to the input of the differential amplifier circuit, and thus to prevent the generation of offset and the like. The switches which are connected between the PDs and the Vcc line put the diodes in backward bias state, and also become the suppliers of the photocurrent from the PD that is not in use. The photocurrent generated in the PD that is not in use is absorbed into the Vcc line via the NPN transistors 103 and 104; therefore, charge storage is not generated in the PDs. Consequently, when a PD is switched to the next PD to be used, it is possible to prevent the generation of offset current due to the charge storage in the PD.

According to the conventional structure disclosed in the Japanese Laid-Open Patent Application No. 2001-202646, an inverting-input-side transistor is required for each of the PDs. However, according to the present embodiment, only one inversing-input-side transistor is required.

Thus, it is possible not only to down-size a circuit but also to reduce the offset influence caused by variation in transistor performance. This is because it is difficult to adjust the performance of each transistor to be the same as the performance of the reference-input-side transistor when plural inverting-input-side transistors are provided in the circuit.

Particularly in the case of recording, when the PD 101 is selected as the one that operates predominantly, the followings may be caused: the incident light projected on the PD 101 is strong; an excessive amount of photocurrent is generated; the output transistor 116 of the differential amplifier circuit 118 is saturated; a voltage drop in the gain resistor 114 decreases the inverting input potential of the differential amplifier circuit 118; and the NPN transistor 109 is turned off. In this case, even if the light that enters into the PD 101 is blocked, it takes a predetermined amount of time for the differential amplifier circuit 118 to recover, so that the time for saturation recovery gets longer.

In order to solve the above-mentioned problem, by applying a potential lower than the base potential of the inverting-input-side NPN transistor 109 of the differential amplifier circuit 118 by 1 diode voltage (0.7V) to the base 107 of the NPN transistor 103, the NPN transistor 103 is turned on when the voltage drop in the gain resistor 114 decreases the base potential of the NPN transistor 109 by 0.7V or more from the reference potential.

Thus, an excessive amount of photocurrent is supplied from the emitter of the NPN transistor 103, which never turns off the inverting-input-side NPN transistor 109 of the differential amplifier circuit 118. Therefore, it is possible to shorten the saturation recovery time of the differential amplifier circuit 118.

Second Embodiment

Figure 3:
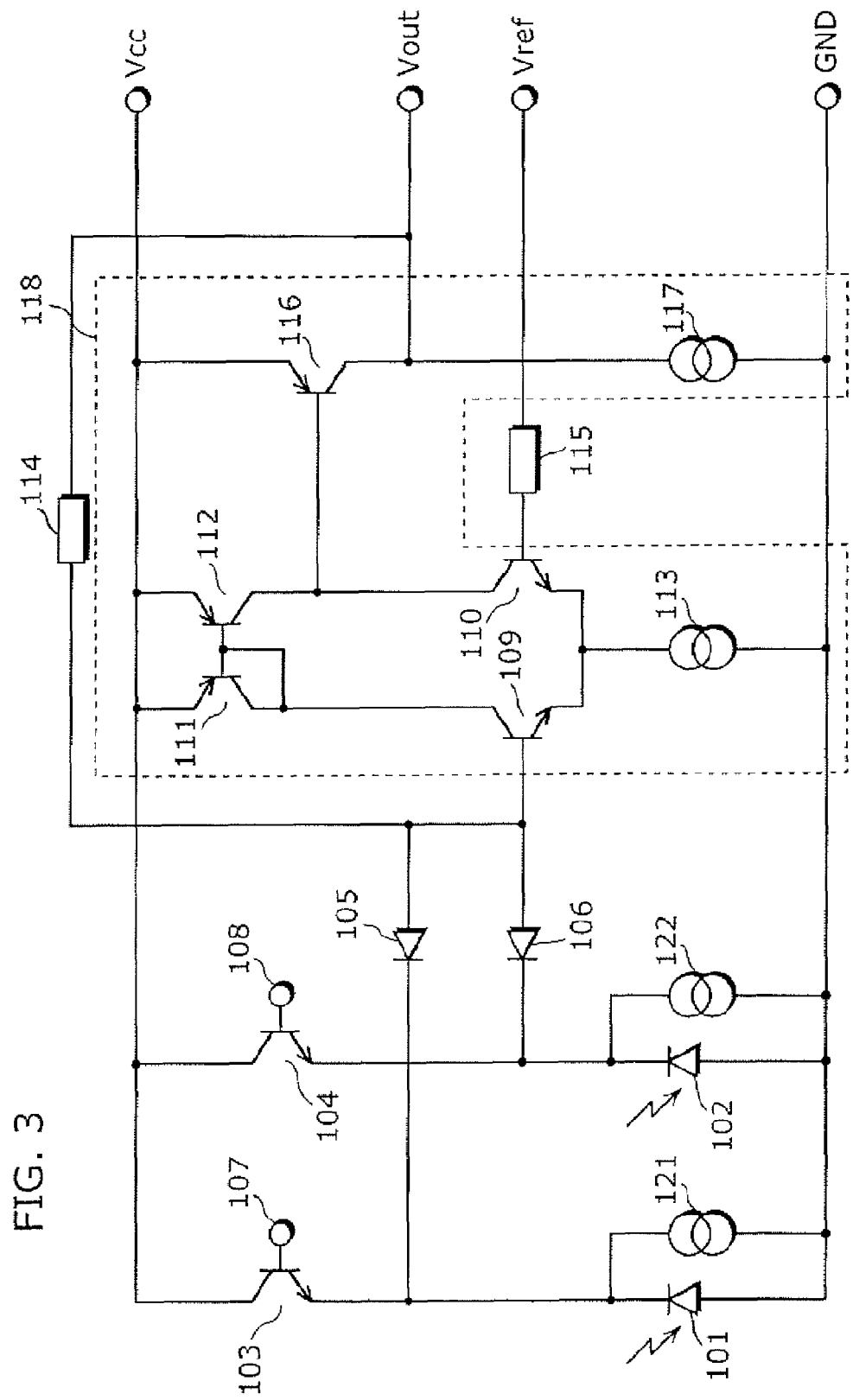
FIG. 3 is a circuit diagram showing an example of the light-receiving amplifier circuit according to a second embodiment of the present invention.

FIG. 3 is a circuit diagram showing an example of the light-receiving amplifier circuit according to the second embodiment of the present invention.

The circuit shown in the present embodiment differs from the circuit shown in the first embodiment in that constant current sources 121 and 122 are connected between the cathodes of the PDs 101 and 102, and the GND.

According to the present embodiment, when the NPN transistors 103 and 104 are OFF, it is possible to supply idling current from the constant current source 121 or 122 to the diode 105 or 106. Therefore, the amount of load resistance in the diode 105 or 106 during the operation is reduced and AC driving and response can be performed at high speed, which is advantageous, for example, in recording and reproduction with high-speed performance.

Third Embodiment

Figure 4:
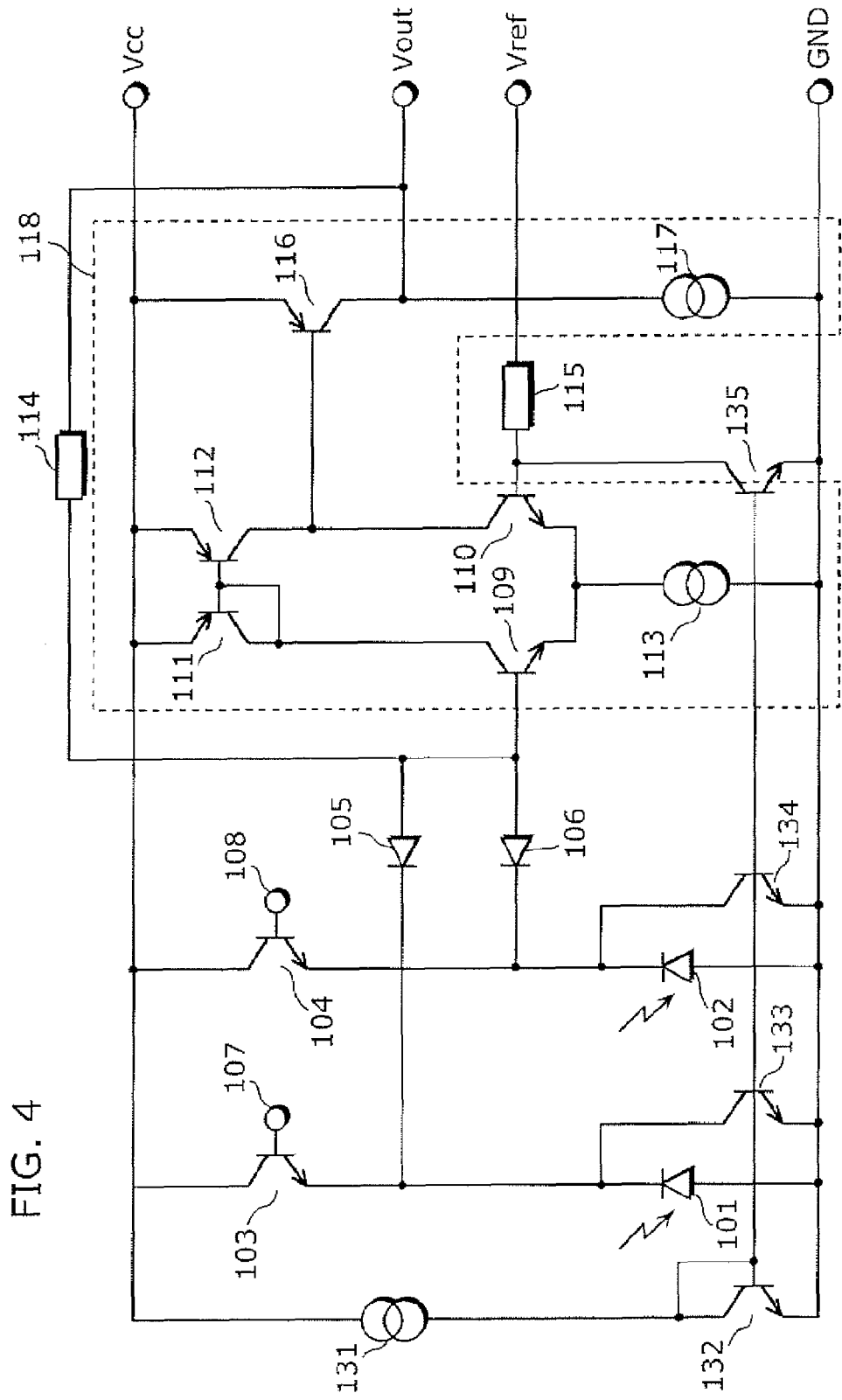
FIG. 4 is a circuit diagram showing an example of the light-receiving amplifier circuit according to a third embodiment of the present invention.

FIG. 4 is a circuit diagram showing an example of the light-receiving amplifier circuit according to the third embodiment of the present invention.

The circuit shown in the second embodiment is equipped with the constant current sources 121 and 122 for the PDs 101 and 102. However, in the circuit of the present embodiment, current is applied from a compensation current source 131 to an NPN transistor 132, and NPN transistors 133 and 134 to which the NPN transistor 132 and a base are commonly connected are connected respectively between the cathodes of the PDs 101 and 102 and the GND. Each of the NPN transistors 133, 134 and 132 forms a current mirror circuit, and the collector current of the NPN transistors 133 and 134 can be used instead of the constant current sources 121 and 122. It is therefore possible to decrease the number of constant current sources and reduce the size of a circuit.

In addition, according to the structure of the present embodiment, the NPN transistor 135 is connected between the reference input of the differential amplifier circuit and the GND, and the base of the NPN transistor 135 is commonly connected to the NPN transistors 132, 133 and 134. It is therefore possible to equalize the collector current of the NPN transistor 135 and the collector currents of the NPN transistors 133 and 134. Thus, it is possible to eliminate a difference in the base current between the inverting input NPN transistor 109 and the reference input NPN transistor 110, and thus to cancel the offset of the amplifier circuit.

Fourth Embodiment

Figure 5:
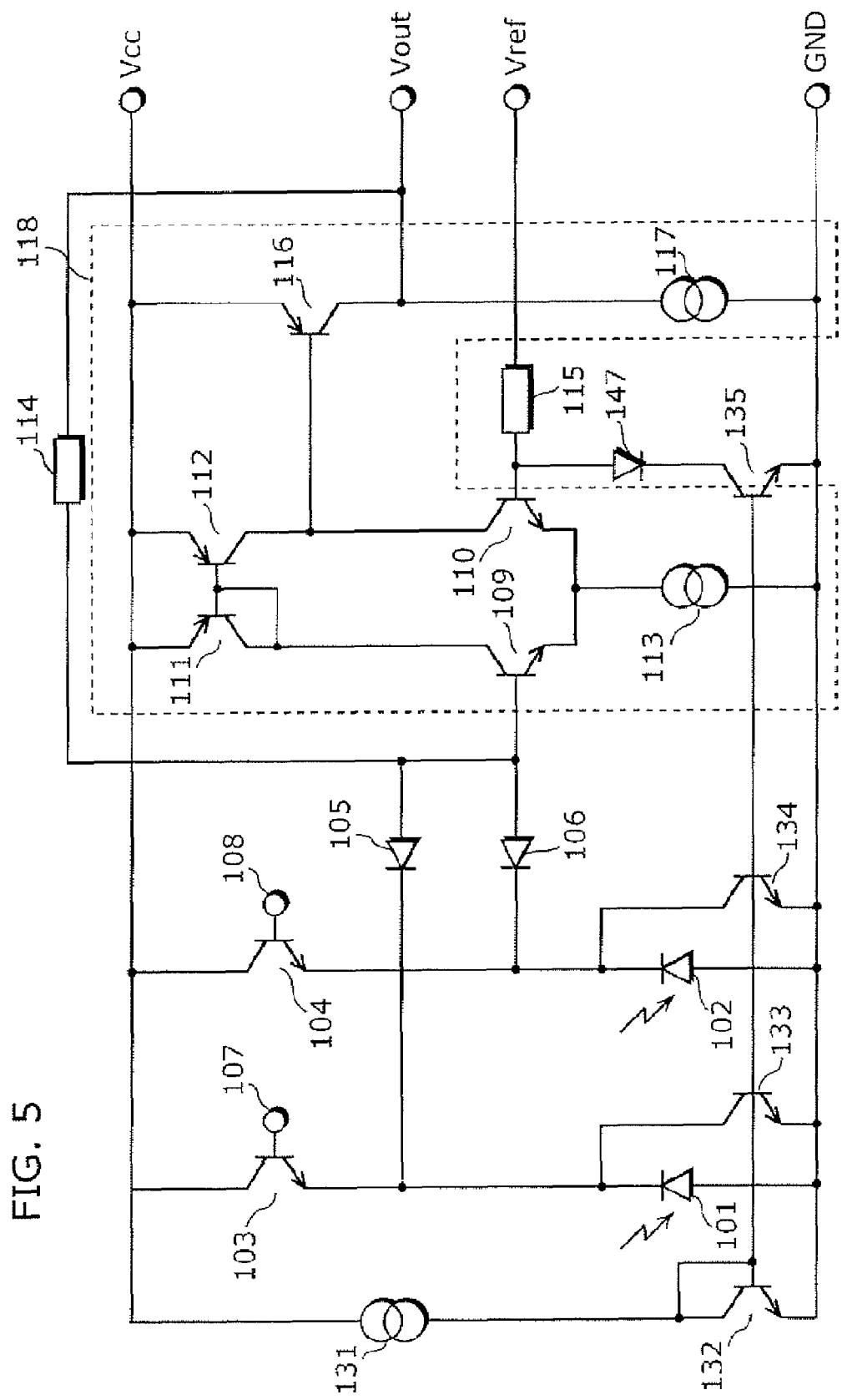
FIG. 5 is a circuit diagram showing an example of the light-receiving amplifier circuit according to a fourth embodiment of the present invention.

FIG. 5 is a circuit diagram showing an example of the light-receiving amplifier circuit according to the fourth embodiment of the present invention.

The circuit of the present embodiment differs from the circuit shown in the third embodiment in that a diode 147 is placed between a base of the reference input NPN transistor 110 and a collector of the NPN transistor 135. Here, the cathode of the diode 147 is connected to the collector of the NPN transistor 135.

In the circuit shown in the third embodiment, the diodes 105 and 106 are inserted between the base of the inverting input NPN transistor 109 and the collectors of the NPN transistors 133 and 134. The voltage drop generated in these diodes causes a difference between the collector potential of the NPN transistors 133 and 134 seen from the GND and the collector potential of the NPN transistor 135. This normally does not impose any problems, but in the case where early effect of transistors cannot be ignored, such a potential difference may cause a difference in the amount of current that flows in the current mirror circuits, which may in turn cause offset displacement or temperature characteristic displacement.

According to the present embodiment, the insertion of the diode 147 as described above can equalize the collector potential of the NPN transistors 133 and 134 seen from the GND and the collector potential of the NPN transistor 135, and eliminate the influence of the early effect so that a light-receiving amplifier circuit with high performance can be achieved.

Fifth Embodiment

Figure 6:
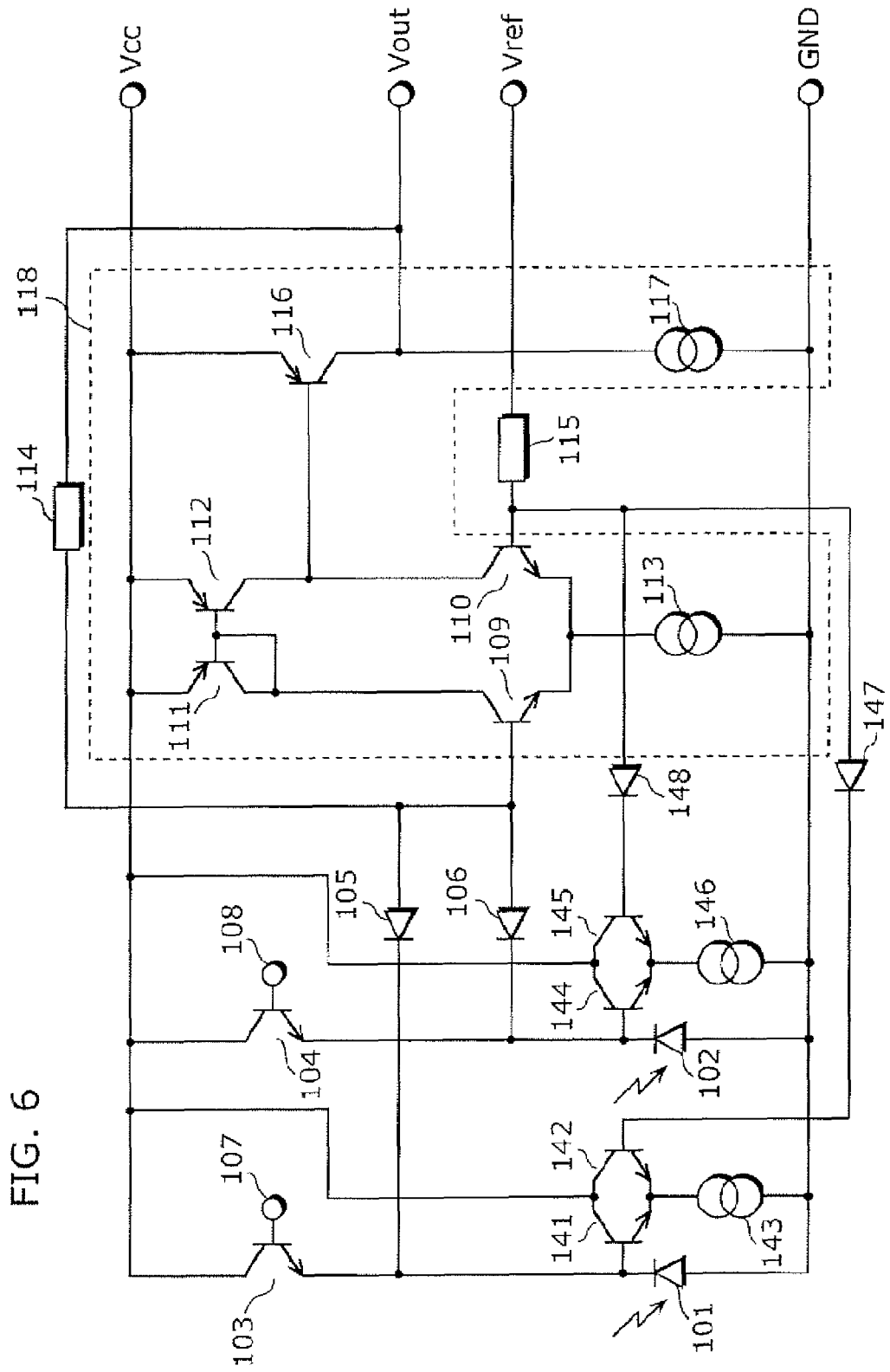
FIG. 6 is a circuit diagram showing an example of the light-receiving amplifier circuit according to a fifth embodiment of the present invention.

FIG. 6 is a circuit diagram showing an example of the light-receiving amplifier circuit according to the fifth embodiment of the present invention.

The circuit of the present embodiment differs from the circuit shown in the first embodiment in the following points. In the present embodiment, a circuit configured of NPN transistors 141, 142 and a constant current source 143 is connected in parallel with the PD 101, while a circuit configured of NPN transistors 144, 145 and a constant current source 146 is connected in parallel with the PD 102.

Here, emitters of the NPN transistors 141 and 142 are commonly connected to one end of the constant current source 143 and the other end of the constant current source 143 is connected to the GND. In addition, the collectors of the NPN transistors 141 and 142 are commonly connected to the Vcc line. A base of the NPN transistor 141 is connected to a cathode of the PD 101, while a base of the NPN transistor 142 is connected to a base of the reference input NPN transistor 110 via a diode 147.

Likewise, emitters of the NPN transistors 144 and 145 are commonly connected to one end of the constant current source 146, whereas the other end of the constant current source 146 is connected to the GND. In addition, collectors of the NPN transistors 144 and 145 are commonly connected to the Vcc line. A base of the NPN transistor 144 is connected to a cathode of the PD 102, while a base of the NPN transistor 145 is connected to a base of the reference input NPN transistor 110 via a diode 148.

Also, the cathodes of the diodes 147 and 148 are respectively connected to respective bases of the NPN transistors 142 and 145, and anodes of the diodes 147 and 148 are commonly connected to a resistor 115 so that the diodes 147 and 148 are connected in a forward direction with respect to the direction in which a base current in each of the NPN transistors flows.

The present embodiment is suitable for subtle adjustment of current since the base current of the NPN transistor is used as the idling current of the diodes 105 and 106, compared with the third and fourth embodiments in which current mirror circuits using the collector currents of the NPN transistors are applied.

Also, the same effects as described in the second through fourth embodiments can be obtained. For example, in the case where the NPN transistor 103 is OFF and the NPN transistor 104 is ON, a base current of the NPN transistor 141 flows as an idling current of the diode 105, so that load resistance of the diode 105 gets smaller and AC driving and response can be performed with high speed. Also, a base current of the NPN transistor 142 flows as an idling current of the diode 147 so that the amount of current is equalized between the inverting input and the reference input of the differential amplifier circuit 118, and thus offset is cancelled.

The NPN transistor 145 becomes OFF and the current of the constant current source 146 is supplied, without exceptions, from the emitter of the NPN transistor 144. In this case, the base current of the NPN transistor 145 is blocked, which stops the current supply from the reference input of the differential amplifier circuit 118, and thus offset cancel no longer operates. This prevents the current from excessively flowing to the base of the reference input NPN transistor 110, and offset of the light-receiving amplifier circuit of a selected PD can be cancelled.

Sixth Embodiment

Figure 7:
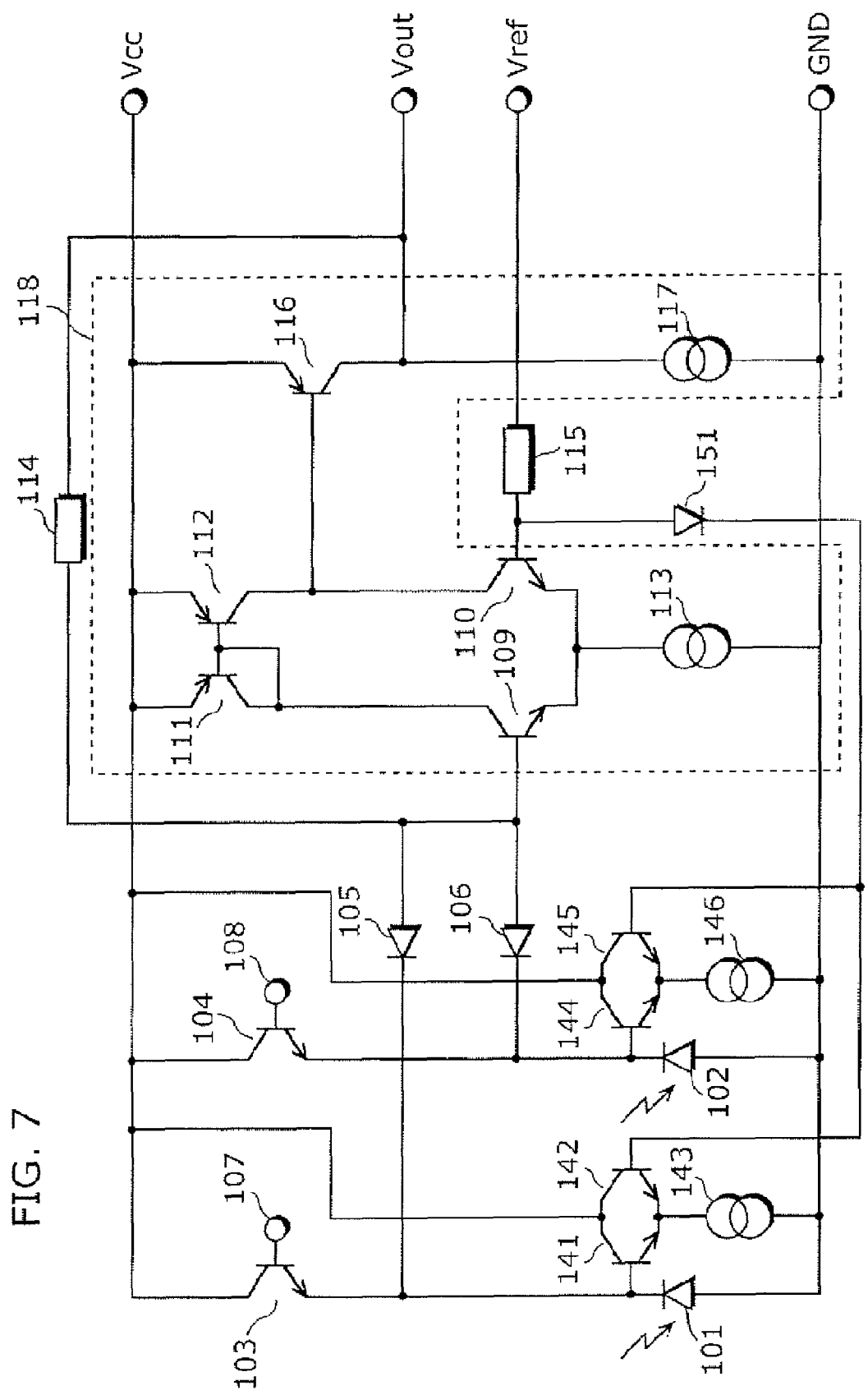
FIG. 7 is a circuit diagram showing an example of the light-receiving amplifier circuit according to a sixth embodiment of the present invention.

FIG. 7 is a circuit diagram showing an example of the light-receiving amplifier circuit according to the sixth embodiment of the present invention.

The circuit shown in the present embodiment differs from the circuit shown in the fifth embodiment in that the diodes 147 and 148 which function as offset cancellers are configured into one diode 151. With such a structure, it is possible to reduce the number of elements to be used for plural light-receiving elements, which encourages the downsizing of the circuit.

Seventh Embodiment

Figure 8:
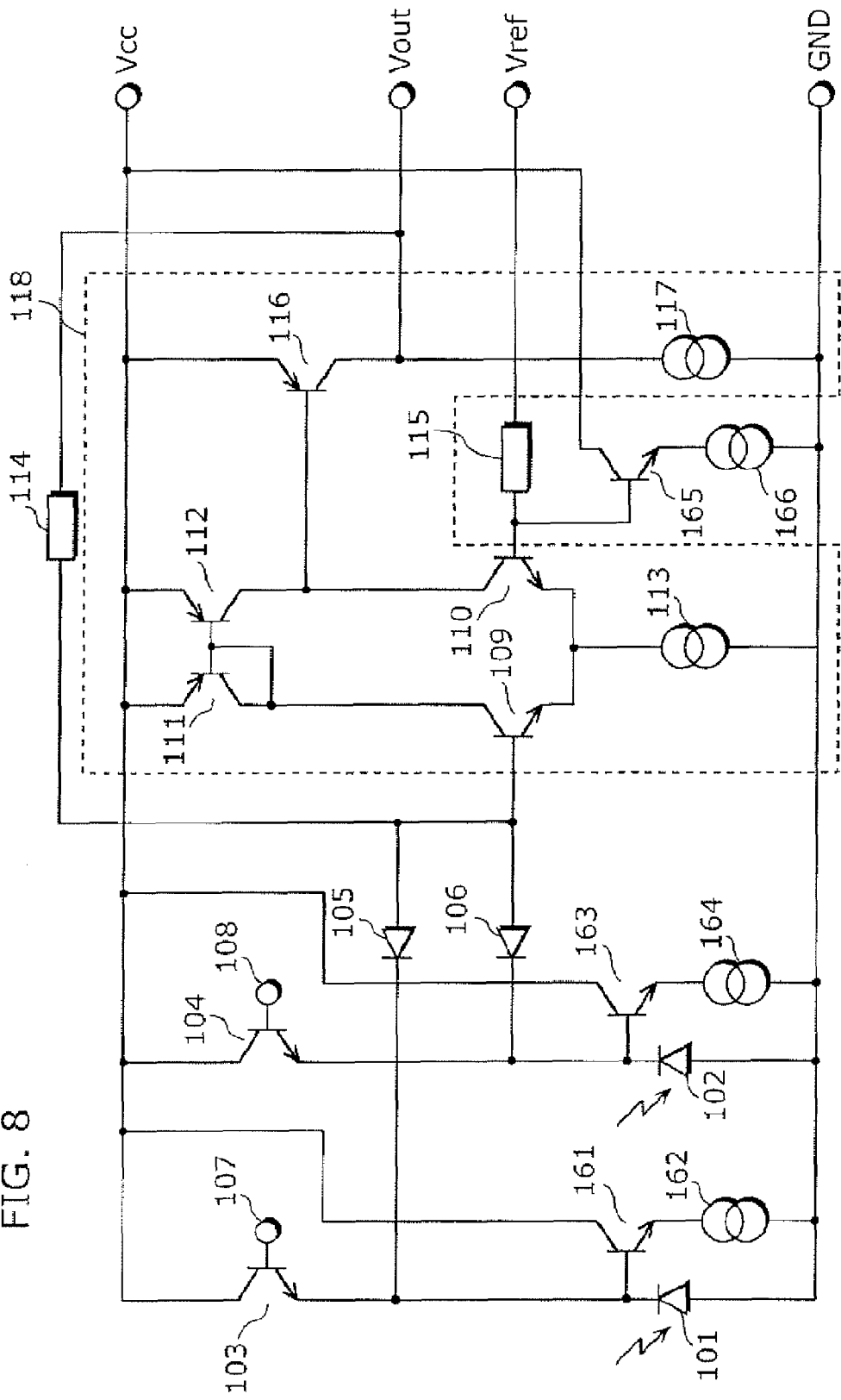
FIG. 8 is a circuit diagram showing an example of the light-receiving amplifier circuit according to a seventh embodiment of the present invention.

FIG. 8 is a circuit diagram showing an example of the light-receiving amplifier circuit according to the seventh embodiment of the present invention.

The circuit of the present embodiment differs from the circuit described in the first embodiment in the following points. Firstly, emitters of NPN transistors 161 and 163 are connected to constant current sources 162 and 164, while collectors of the NPN transistors 161 and 163 are connected to a Vcc line and bases of the NPN transistors 161 and 163 are connected to the cathodes of the light-receiving elements 101 and 102. Secondly, a base of an NPN transistor 165 is connected to the base of the reference input NPN transistor 110 and a collector of the NPN transistor 165 is connected to the Vcc line, and an emitter of the NPN transistor 165 is connected to a constant current source 166.

According to the present embodiment, an idling current is supplied from a base current of the NPN transistors 161 and 163 to the diodes 105 and 106, so that the amount of the idling current can be made smaller, as is the case of the fifth embodiment. Thus, the present embodiment is suitable for subtle adjustment.

The constant current sources 162, 164 and 166 are placed independently so that by rendering the current values of the sources to be the same, it is possible to cancel the offset of the differential amplifier circuit.

Eighth Embodiment

Figure 9:
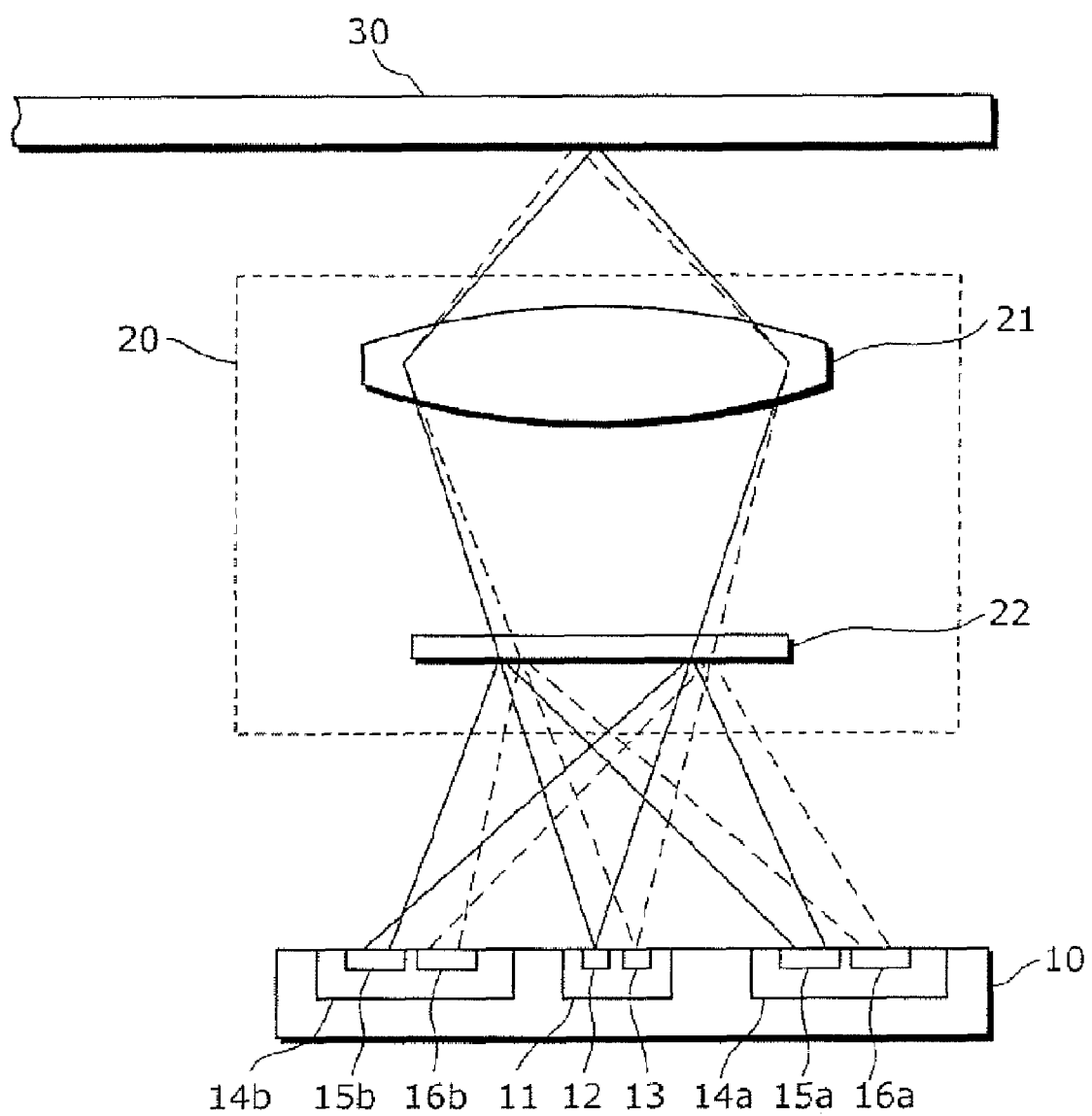
FIG. 9 is a diagram showing an example of the configuration of the optical pick-up device according to an eighth embodiment of the present invention.

FIG. 9 is a pattern diagram showing an example of the configuration of the optical pick-up device according to the eighth embodiment of the present invention. The optical pick-up device is configured of a semiconductor substrate 10 and an optical system 20 to be commonly used by CDs and DVDs. FIG. 9 additionally shows an optical storage medium 30.

In the semiconductor substrate 10, a light-emitting unit 11 and light-receiving units 14a and 14b are formed. The optical system 20 is configured of an objective lens 21 and a hologram element 22.

The light-emitting unit 11 is, for example, a double wavelength semiconductor laser device and radiates an infrared laser beam for CDs and a red laser beam for DVDs respectively from light-emitting points 12 and 13 which are placed at regular intervals. The optical paths of the respective infrared laser beam and red laser beam are indicated by solid and dotted lines in FIG. 9.

The light of respective wavelengths radiated from the light-emitting unit 11 passes through the objective lens 21 and is reflected at the medium 30, and then, divided into a radial direction of the medium by the hologram element 22, and projected on the light-receiving elements 15a and 16a as well as the light-receiving elements 15b and 16b which are placed in different positions depending on the respective wavelengths.

As has already been known, a projection spot diameter of each of the divided reflected lights and unbalance in an optical amount are used for control on focusing and tracking. Also, a total amount of each of the reflected lights is used for reading information.

The light-receiving amplifier circuit shown in FIGS. 2 through 8 is, for example, placed in the light-receiving units 14a and 14b of the optical pick-up device. The PDs 101 and 102 are for CDs and DVDs respectively: in the light-receiving unit 14a, the PDs 101 and 102 are the light-receiving elements 15a and 16a; while in the light-receiving unit 14b, the PDs 101 and 102 are the light-receiving elements 15b and 16b.

When recording on or playing back a CD, the current supply switch 103 is turned off and the current supply switch 104 is turned on. In contrast, when recording on or playing back a DVD, the current supply switch 103 is turned on and the current supply switch 104 is turned off.

According to the present embodiment, in the optical pick-up device in which the light-receiving units for CDs and DVDs are integrated, it is possible, during the use of one of a CD or a DVD, to prevent the photocurrent from flowing from the receiving unit of the other of the CD and the DVD into the amplifier circuit. Therefore, photocurrent from a desired PD can be properly amplified, and it is possible to realize an optical pick-up device with high performance which does not cause any malfunctions.

Note that it is preferable that the NPN transistors used in the first through seventh embodiments have the same level of performance, namely, the same size and the same current driving capacity. The same applies to the diodes.

In the first through seventh embodiments, diodes are used as rectifier cells; however, transistors may be used instead. Likewise, for the light-receiving elements, elements equipped with a photoelectric conversion function may be generally used instead of photodiodes.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The light-receiving amplifier circuit according to the present invention can be widely used as an amplifier circuit which selectively amplifies one or more photocurrents obtained respectively from light-receiving elements, and is particularly suitable as a down-sized optical pick-up device which can write and read information to and from the optical disc medium of plural kinds using lights of different wavelengths.

What is claimed is:

1. A light-receiving amplifier circuit, comprising:
a differential amplifier circuit;
a gain resistor connected between an inverting input unit of said differential amplifier circuit and an output of said differential amplifier circuit;
light-receiving elements, each of said light-receiving elements generating a photocurrent according to an amount of light received;
a plurality of switches, each switch of said plurality of switches being connected between an output of a corresponding light-receiving element and said inverting input unit of said differential amplifier circuit, to select the corresponding light-receiving element as a light-receiving element for supplying said photocurrent to said differential amplifier; and
a plurality of rectifier cells, each rectifier cell of said plurality of rectifier cells preventing a photocurrent generated by a non-corresponding light-receiving element, that is not selected, from flowing to the inverting input unit,
wherein an end of each of said rectifier cells is serially connected to a corresponding one of said light-receiving elements and a respective other end of each of said rectifier cells are commonly connected to said inverting input unit, and
wherein each of said switches is connected to a connection point between a corresponding rectifier cell and said corresponding light-receiving elements.

2. The light-receiving amplifier circuit according to claim 1,
wherein said switches comprise NPN transistors, and
a collector of each of the NPN transistors is connected to a power potential, an emitter of each of the NPN transistors is connected to an output of the corresponding light-receiving element, and when a potential higher than a potential of the inverting input unit of said differential amplifier circuit is supplied to a base of each of the NPN transistors, the respective NPN transistors block a supply of photocurrent to the inverting input unit of said differential amplifier circuit by backward biasing the corresponding rectifier cell.

3. The light-receiving amplifier circuit according to claim 1, further comprising:
a plurality of constant current sources, each constant current source of said plurality of constant current sources being connected in parallel with a corresponding light-receiving element, at a connection between a corresponding rectifier cell and said corresponding light-receiving element, for supplying a current that flows in a same direction as a direction of the photocurrent of the corresponding light-receiving element.

4. The light-receiving amplifier circuit according to claim 3, further comprising:
a compensation current source for supplying a reference input unit of said differential amplifier circuit with current,
wherein said plurality of constant current sources and said compensation current source respectively configure a current mirror circuit, and
said plurality of constant current sources and said compensation current source respectively supply a same amount of current.

5. The light-receiving amplifier circuit according to claim 1, further comprising:
a second rectifier cell connected between a compensation current source and a reference input unit of said differential amplifier circuit in a forward direction of a current that flows to said compensation current source.

6. The light-receiving amplifier circuit according to claim 1, further comprising:
first NPN transistors, second NPN transistors, constant current sources, and additional rectifier cells,
wherein one of said first NPN transistors, one of said second NPN transistors, one of said constant current sources and one of said additional rectifier cells respectively correspond to one of said light-receiving elements,
a collector of said first NPN transistor and a collector of said second NPN transistor are connected to a power potential,
an emitter of said first NPN transistor and an emitter of said second NPN transistor are commonly connected to one end of said constant current source,
the other end of said constant current source is grounded,
a base of said first NPN transistor is connected to an output of said light-receiving element,
a base of said second NPN transistor is connected to one end of said additional rectifier cell placed in a direction of a base current, and
an other end of said additional rectifier cell is connected to a reference input unit of said differential amplifier circuit.

7. The light-receiving amplifier circuit according to claim 1, further comprising:
first NPN transistors, second NPN transistors, constant current sources, and a further rectifier cell,
wherein one of said first NPN transistors, one of said second NPN transistors and one of said constant current sources respectively correspond to one of said light-receiving elements,
a collector of said first NPN transistors and a collector of said second NPN transistors are connected to a power potential,
an emitter of said first NPN transistor and an emitter of said second NPN transistor are connected to one end of said constant current source,
the other end of said constant current source is grounded,
a base of said first NPN transistor is connected to an output of said light-receiving element,
a base of said second NPN transistor is commonly connected to a base of said second NPN transistor of another one of said light-receiving elements, and is also connected to said further rectifier cell placed in a forward direction with respect to a direction of base current, and
an other end of said further rectifier cell is connected to a reference input unit of said differential amplifier circuit.

8. The light-receiving amplifier circuit according to claim 1, further comprising:
first NPN transistors, first constant current sources respectively corresponding to each of said light-receiving elements, a second NPN transistor, and a second constant current source,
wherein a collector of one of said first NPN transistors which corresponds to one of said light-receiving elements is connected to a power potential,
an emitter of said first NPN transistor is connected to one end of one of said first constant current source,
an other end of said first constant current source is grounded,
a base of said first NPN transistor is connected to an output of said light-receiving element,
a collector of said second NPN transistor is connected to the power potential,
an emitter of said second NPN transistor is connected to one end of said second constant current source,
an other end of the second constant current source is grounded, and
a base of said second NPN transistor is connected to a reference input unit of said differential amplifier circuit.

9. An optical pick-up device which can reproduce information onto plural types of optical disc media using lights of different wavelengths, said optical pick-up device comprising at least:
a light emitting source which emits lights of different wavelengths; and
the light-receiving amplifier circuit according to claim 1,
wherein said light-receiving elements of said light-receiving amplifier circuit respectively receive the lights of the different wavelengths.

* * * * *